United States Patent
Tani et al.

(10) Patent No.: US 7,017,265 B2
(45) Date of Patent: Mar. 28, 2006

(54) METHOD FOR MANUFACTURING MULTILAYER WIRING BOARD, AND MULTILAYER WIRING BOARD MANUFACTURED THEREBY

(75) Inventors: Motoaki Tani, Kawasaki (JP); Nobuyuki Hayashi, Kawasaki (JP); Tomoyuki Abe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 341 days.

(21) Appl. No.: 10/279,980

(22) Filed: Oct. 25, 2002

(65) Prior Publication Data
US 2003/0145458 A1 Aug. 7, 2003

(30) Foreign Application Priority Data
Feb. 7, 2002 (JP) .............................. 2002-031516

(51) Int. Cl.
*H01K 3/10* (2006.01)
(52) U.S. Cl. ............................ 29/852; 29/825; 29/830; 29/846; 427/96.1
(58) Field of Classification Search .............. 427/96.1; 29/846, 825, 830, 852
See application file for complete search history.

(56) References Cited

U.S. PATENT DOCUMENTS

| 4,499,152 A | * | 2/1985 | Green et al. | ................. 428/448 |
| 6,242,079 B1 | * | 6/2001 | Mikado et al. | ............. 428/209 |
| 6,391,220 B1 | * | 5/2002 | Zhang et al. | ................. 216/67 |

FOREIGN PATENT DOCUMENTS

| JP | 5-335314 | 12/1993 |
| JP | 2001-323381 | 11/2001 |

* cited by examiner

*Primary Examiner*—Carl J. Arbes
(74) *Attorney, Agent, or Firm*—Armstrong, Kratz, Quintos, Hanson & Brooks, LLP.

(57) ABSTRACT

A method is provided for manufacturing a multilayer wiring board wherein good adhesion is achieved between an insulating layer and a wiring pattern. The multilayer wiring board has a laminar structure which includes insulating layers and a wiring pattern. The method includes at least the steps of sticking a support whose surface has been treated with a coupling agent onto an insulating layer with a coupling agent interposed therebetween, and transferring the coupling agent to the insulating layer by removing the support while leaving the coupling agent on the insulating layer.

18 Claims, 11 Drawing Sheets

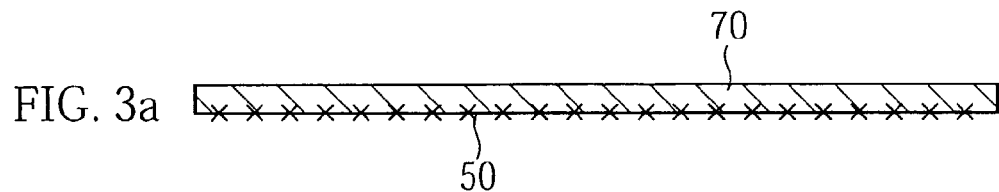
FIG. 3a
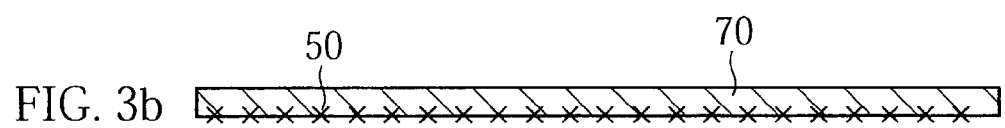
FIG. 3b
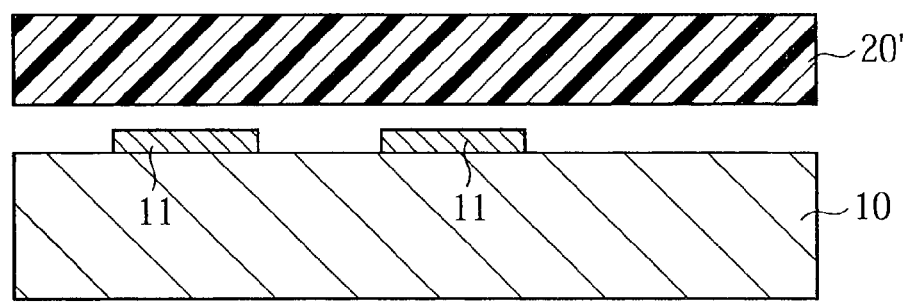
FIG. 3c
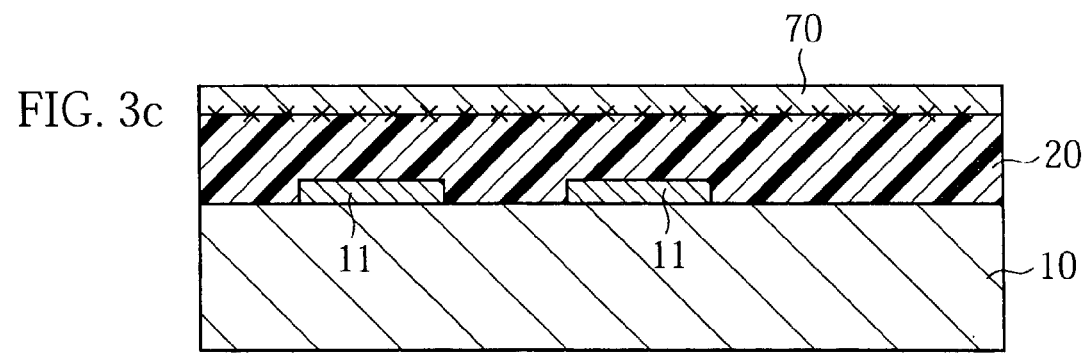
FIG. 3d
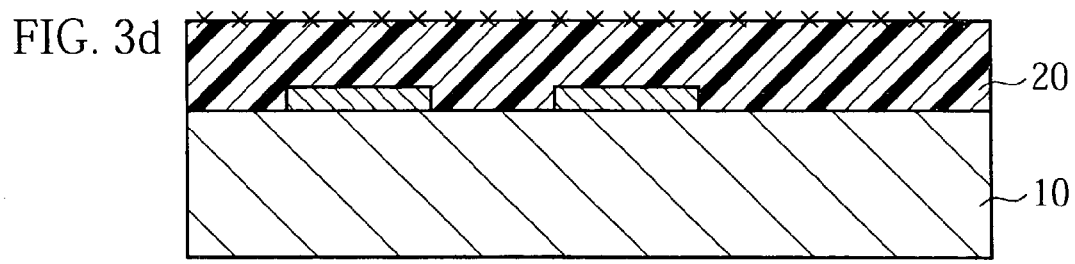

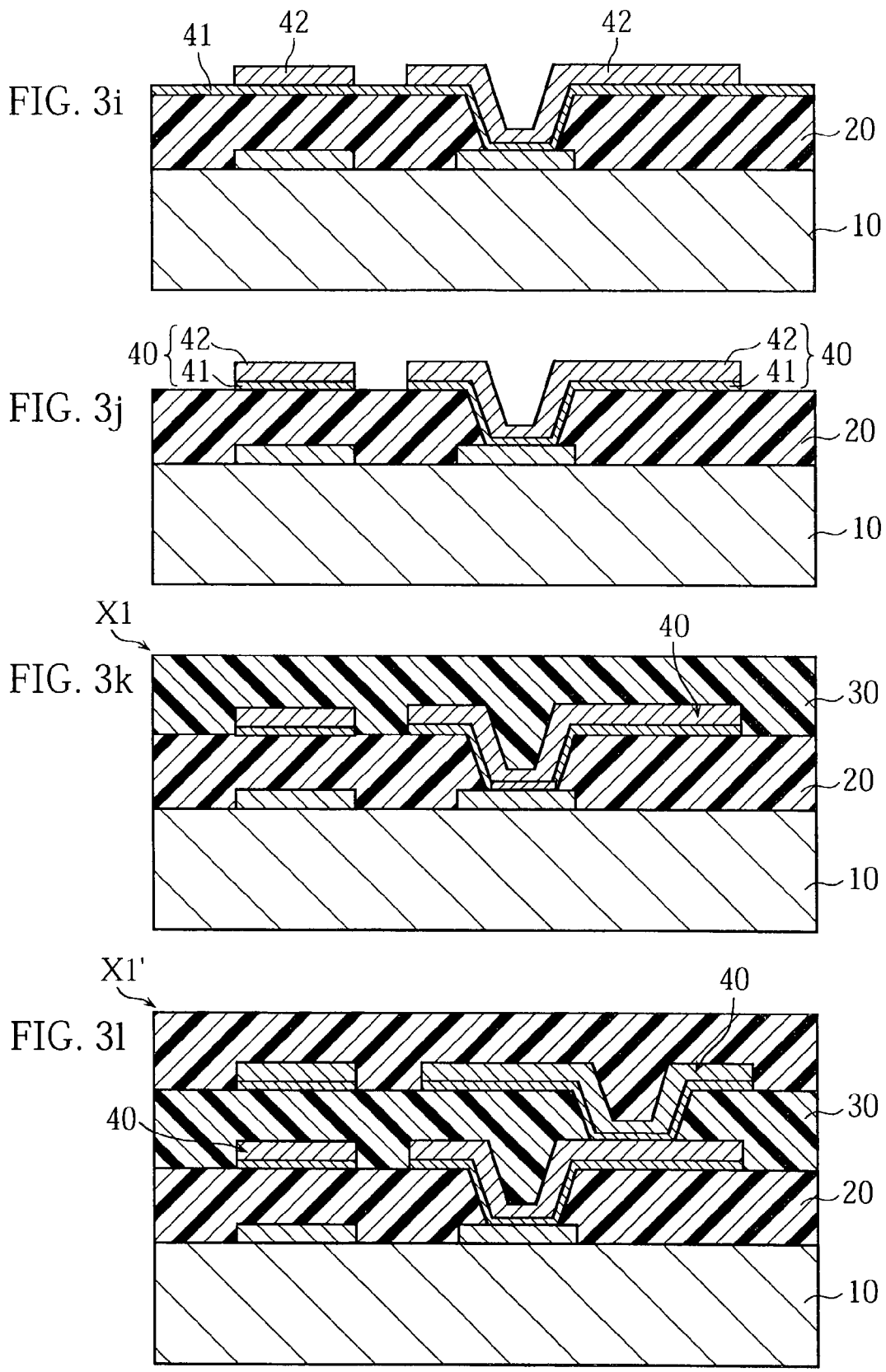

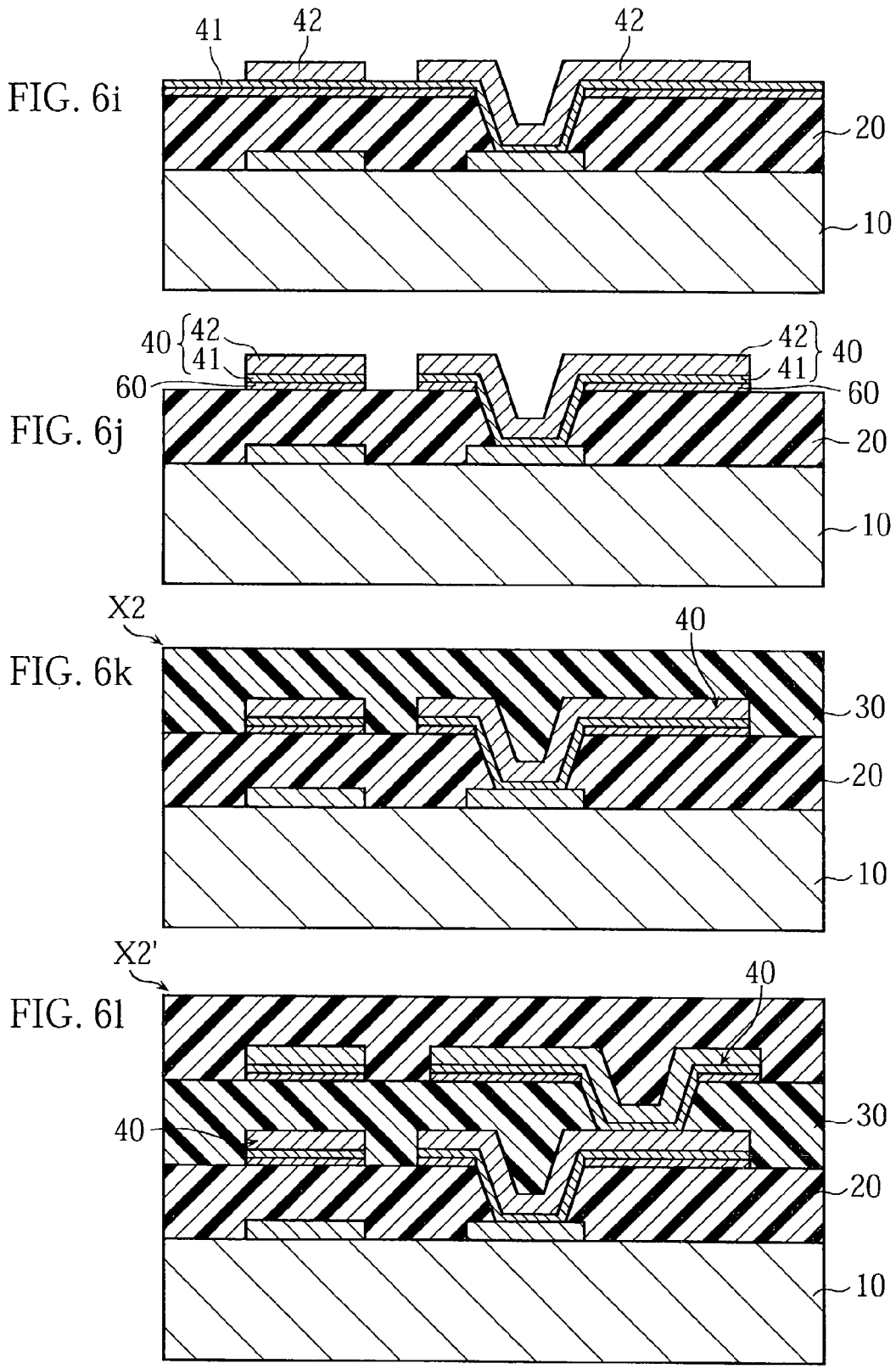

METHOD FOR MANUFACTURING MULTILAYER WIRING BOARD, AND MULTILAYER WIRING BOARD MANUFACTURED THEREBY

BACKGROUND OF THE INVENTION

1. Field of the Invention

The present invention relates to a method for manufacturing a multilayer wiring board used in the circuitry of electrical and electronic devices.

2. Description of the Related Art

As demand has increased in recent years for electronic devices that are smaller, offer higher performance, and are less expensive, the high-density mounting of the electronic parts incorporated in these electronic devices has been increasingly rapidly. To meet this need for high-density mounting, a built-up multilayer wiring structure in which multiple layers of wiring are formed is sometimes employed for the substrate on which the electronic parts are mounted. With a built-up multilayer wiring structure, wiring patterns are embedded between a plurality of built-up insulating layers, and the various wiring patterns are electrically connected by vias provided to via holes made in the insulating layers.

To form a built-up multilayer wiring structure, first a built-up insulating layer is formed on a supporting substrate or another built-up insulating layer on which a wiring pattern has already been formed, from above this wiring pattern. Next, a via hole is formed in this insulating layer. Methods that have been employed to form via holes include forming a hole in the insulating layer by photolithography using a photosensitive resin as the insulating layer material, and a method in which a hole is formed in the insulating layer by irradiation with a laser.

After the via hole has been formed in the insulating layer, a film of a conductor material is formed over the insulating layer by electroless plating or electroplating. The conductor material here forms a via in the via hole. Next, a wiring pattern is formed by etching the conductor material film. After a wiring pattern has thus been formed on the insulating layer, the series of steps from the lamination of the insulating layer up to the wiring pattern formation is repeated as many times as necessary, which allows a multilayer circuit to be produced, and as a result the degree of integration of the circuit can be raised.

With a conventional multilayer wiring board having a built-up multilayer wiring structure such as this, the wiring pattern is formed over the insulating layer only after the surface of the insulating layer has been subjected to a roughening treatment in order to ensure good adhesion between the insulating layer and the wiring pattern. More specifically, bumps and recesses are formed at an $R_{max}$ of about 5 μm, for example, on the exposed insulating layer surface, over which first electroless copper plating and then copper electroplating are performed, thereby forming a copper wiring pattern. This roughening of the insulating layer surface affords good adhesion through a physical anchoring effect between the insulating layer and the copper wiring pattern.

Nevertheless, with this conventional process, it was still sometimes impossible to achieve the desired adhesion between the insulating layer and the wiring pattern. For instance, the peel strength, as given by the 90-degree peel test set forth in JIS C 6481, is usually less than 1 kgf/cm. If the adhesion is insufficient between the insulating layer and the wiring pattern, there will tend to be such problems as the inability to form a good micro-wiring structure.

Also, if the insulating layer surface is roughened to a surface roughness ($R_{max}$) of about 5 μm, then with wiring having a small contact area with the insulating layer, the adhesion to the insulating layer will tend to decrease, which may preclude a reduction in wiring size. Consequently, the adhesion of a wiring pattern to an insulating layer in a built-up wiring structure must be good enough that a peel strength of at least 1 kgf/cm can be achieved in the above-mentioned 90-degree peel test, while the insulating layer is only roughened to an extent that will not hamper a reduction in wiring size.

SUMMARY OF THE INVENTION

The present invention was conceived under these circumstances, and it is an object of the present invention to provide a method for manufacturing multilayer wiring board which can achieve high adhesion between an insulating layer and a wiring pattern.

The first aspect of the present invention provides a method for manufacturing a multilayer wiring board having a laminar structure comprising an insulating layer and a wiring pattern. This manufacturing method comprises the steps of sticking a support, which has a surface treated with a coupling agent, onto the insulating layer with the coupling agent interposed therebetween, transferring the coupling agent to the insulating layer by removing the support while leaving the coupling agent on the insulating layer, and forming a wiring pattern on the insulating layer onto which the coupling agent has been transferred.

With this method, the adhesion between the insulating layer and the wiring pattern laminated thereto can be increased in a multilayer wiring board. With a multilayer wiring board manufactured according to the method pertaining to the first aspect of the present invention, a coupling agent is interposed between an insulating layer composed of a resin material (organic material) and a wiring pattern composed of a metal material (inorganic material). This coupling agent can be, for example, a silane-based coupling agent or titanate-based coupling agent. To use the silane-based coupling agent in FIG. 7 as an example, this coupling agent has functional groups (—Y: vinyl group, amino group, epoxy group, imidazole group, etc.) capable of bonding with an organic material A and functional groups (—OR: hydroxyl group, methoxy group, ethoxy group, etc.) capable of bonding with an inorganic material B. With a multilayer wiring board obtained by the method in the first aspect of the present invention, it is believed that —Y is incorporated into the resin structure of the insulating layer, which is composed of a resin material, and —OR is chemically bonded to the surface of the wiring pattern, which is composed of a metal material. It seems that this action of the coupling agent is what raises the adhesion of the wiring pattern to the insulating layer.

With the first aspect of the present invention, the coupling agent is temporarily tacked to the surface of a support in the form of a film, for example, and is transferred to the insulating layer surface through a step in which this support is stuck onto the insulating layer. Another method that can be used tack the coupling agent to the insulating layer surface is to dip the insulating layer in a solution of the coupling agent or otherwise cause the coupling agent to act directly on the insulating layer surface. However, research on the part of the inventors has revealed that depending on the coupling agent treatment, such as dipping a material in a coupling agent solution or spraying a material with a coupling agent solution, the coupling agent will adhere at a higher surface coverage if applied to the support, which is composed of a metal material (inorganic material), rather than to the insulating layer, which is composed of a resin material (organic material). Specifically, when a coupling agent is made to act directly, there is usually more coupling agent adhering per unit of surface area to the support than to the insulating layer. The likely reason for this is that the —OR groups (hydroxyl groups, methoxy groups, ethoxy groups, etc.) had by the coupling agent readily form alkoxide-like bonds (—O-M-; where M is a metal, etc.) with the metal or other inorganic material that makes up the support. When the coupling agent adheres to the support via —OR groups, this coupling agent that covers the support surface will have functional groups (—Y) capable of bonding with an organic material exposed on the outside and arranged regularly on the support surface.

With the first aspect of the present invention, the coupling agent thus adheres to the support at a high surface coverage and with its functional groups (—Y) exposed, and the support is stuck onto the insulating layer surface with this coupling agent interposed therebetween. The coupling agent is then fixed to the insulating layer via the functional groups (—Y) by heating and pressing this support onto the insulating layer with a vacuum press or a vacuum laminator, for example, and thereby incorporating the functional groups (—Y) of the coupling agent into the resin structure of the insulating layer. After this, just the support is removed by etching, for instance, to transfer the coupling agent to the insulating layer, which results in a state in which the coupling agent adheres to the insulating layer at a high surface coverage. When a wiring pattern is thus formed on an insulating layer through a coupling agent adhering at a high surface coverage, most of the coupling agent is between the insulating layer and the wiring pattern, and as a result it is possible to achieve better adhesion between the insulating layer and the wiring pattern laminated thereto. Thus, with the first aspect of the present invention, better adhesion of the coupling agent to the insulating layer can be achieved than when the insulating layer surface is treated directly with the coupling agent.

Further, with the first aspect of the present invention, even when the insulating layer is subjected to a roughening treatment, sufficient adhesion between the insulating layer and the wiring pattern can be obtained while limiting the roughening to an extent that will not hamper a reduction in wiring size. As a result, it is possible to form a good micro-wiring structure in a multilayer wiring board.

JP-A 5-335314, for example, discloses a technique of interposing a coupling agent between a bump and an insulating layer formed on a circuit board surface in an effort to improve the joint between the bumps formed on a circuit substrate and the substrate itself. However, this coupling agent is made to adhere to the insulating layer surface by dipping the circuit substrate in a coupling agent solution prior to the formation of the bumps, but this is different from the present invention, in which the coupling agent is transferred to the insulating layer surface through the use of a support. Also, the only place the adhesion is improved is between the outermost insulating layer on the circuit substrate and the bumps in contact therewith, and not between the insulating layer and the wiring pattern laminated thereto in a multilayer wiring board. Meanwhile, JP-A 2001-323381 discloses a technique interposing a coupling agent between an insulating layer and an electroless plating layer in order to improve the adhesion between these. However, this coupling agent is made to adhere to the insulating layer surface by dipping the insulating layer in a coupling agent solution prior to the formation of the electroless plating layer, but this is different from the present invention, in which the coupling agent is transferred to the insulating layer surface through the use of a support.

The second aspect of the present invention provides another method for manufacturing a multilayer wiring board having a laminar structure comprising an insulating layer and a wiring layer. This manufacturing method comprises the steps of sticking a support, which is formed with a metal-containing bonding layer having an exposed surface treated with a coupling agent, onto the insulating layer with the coupling agent and the metal-containing bonding layer interposed therebetween; transferring the coupling agent and the metal-containing bonding layer to the insulating layer by removing the support while leaving the coupling agent and the metal-containing bonding layer on the insulating layer; and forming a wiring pattern on the insulating layer onto which the coupling agent and the metal-containing bonding layer have been transferred.

This method affords even better adhesion of the wiring pattern to the insulating layer. The metal-containing bonding layer in the second aspect of the present invention is composed of a metal compound having good adhesion to a wiring pattern composed of a metal material, and being capable of forming bonds with the —OR groups of the coupling agent that are stronger than those of the support. With a multilayer wiring board manufactured according to the method pertaining to the second aspect of the present invention, it is believed that this metal-containing bonding layer is interposed along with the coupling agent between the insulating layer and the wiring pattern, the functional groups (—Y) of the coupling agent are incorporated into the resin structure of the insulating layer, and the functional groups (—OR) are chemically bonded to the metal-containing bonding layer or go beyond the metal-containing bonding layer and are chemically bonded to the wiring pattern. The combined action of the coupling agent and the metal-containing bonding layer further enhances the adhesion of the wiring pattern to the insulating layer.

In the second aspect, the coupling agent is temporarily tacked to the surface of the metal-containing bonding layer provided to the support, but the metal-containing bonding layer, like the support, is composed of an inorganic material including a metal. Accordingly, the coupling agent will adhere at a higher surface coverage if applied to the metal-containing bonding layer, which is an inorganic material, rather than to the insulating layer, which is composed of a resin material (organic material). Therefore, the effect of the second aspect of the present invention is the same as that given above for the first aspect in that transferring the coupling agent from the support to the insulating layer affords higher surface coverage with the coupling agent. Also, in the second aspect of the present invention, at the point when the metal-containing bonding layer is transferred to the insulating layer along with the coupling agent, the step of sticking on the support, which is carried for the purpose of this transfer, can be accomplished under conditions in which the support is pressed against the insulating layer with a vacuum press or a vacuum laminator, for example. Accordingly, the metal-containing bonding layer can be formed in a state of being more securely joined to the insulating layer than when the metal-containing bonding layer is formed directly on the insulating layer by plating or another such technique. In addition, with the second aspect of the present invention, just as with the first aspect, even when the insulating layer is subjected to a roughening treatment, sufficient adhesion can be obtained while limiting the roughening to an extent that will not hamper a reduction in wiring size. As a result, it is possible to form a good micro-wiring structure in a multilayer wiring board.

The third aspect of the present invention provides another method for manufacturing a multilayer wiring board. This method comprises the steps of treating a surface of a support with a coupling agent; forming an insulating layer on a surface of a substrate which is formed with a first wiring pattern; sticking the support onto the insulating layer with the coupling agent interposed therebetween; transferring the coupling agent to the insulating layer by removing the support while leaving the coupling agent on the insulating layer; and forming a second wiring pattern on the insulating layer onto which the coupling agent has been transferred.

When a supporting substrate is used, the side where a first wiring pattern has been formed is the supporting substrate surface or the insulating layer surface, and in the case of a multilayer wiring board in which all the layers comprise built-up insulating layers, this side is the built-up insulating layer surface. Also, in the present invention, the coupling agent treatment step and insulating layer formation step are performed independently in terms of time, with neither order being preferable. Again with a multilayer wiring board obtained by the method pertaining to the third aspect of the present invention, a coupling agent is interposed between the insulating layer and the wiring pattern, and this coupling agent is provided by being transferred from the support to the insulating layer. Therefore, the effect of this third aspect is the same as that given above for the first aspect in terms of the adhesion of the wiring pattern (second wiring pattern) to the insulating layer.

The fourth aspect of the present invention provides another method for manufacturing a multilayer wiring board. This method comprises the steps of forming a metal-containing bonding layer on a support; treating an exposed surface of the metal-containing bonding layer with a coupling agent; forming an insulating layer on a surface of a substrate which is formed with a first wiring pattern; sticking the support onto the insulating layer with the coupling agent and the metal-containing bonding layer interposed therebetween; transferring the coupling agent and the metal-containing bonding layer to the insulating layer by removing the support while leaving the coupling agent and the metal-containing bonding layer on the insulating layer; and forming a second wiring pattern on the metal-containing bonding layer.

The method according to the fourth aspect may further comprise the steps of forming a via hole in the insulating layer onto which the coupling agent and the metal-containing bonding layer have been transferred, and forming a via in the via hole along with forming a second wiring pattern on the metal-containing bonding layer.

In the step of forming the second wiring pattern, or the step of forming the via along with the second wiring pattern in the fourth aspect, preferably an electroless plating film is formed over the insulating layer, a resist pattern is formed over this electroless plating film, an electroplating film is formed in the non-mask region of this resist pattern, the resist pattern is removed, and the electroless plating film not covered by the electroplating film is removed. This plating technique allows a wiring pattern (second wiring pattern) with good adhesion to the insulating layer to be formed.

With a multilayer wiring board obtained by the method pertaining to the fourth aspect of the present invention, a coupling agent and a metal-containing bonding layer are interposed between the insulating layer and the wiring pattern, and the coupling agent and metal-containing bonding layer are provided by being transferred from the support to the insulating layer. Therefore, the advantages of the fourth aspect are the same as those given above for the second aspect in terms of the adhesion of the wiring pattern (second wiring pattern) to the insulating layer. In addition, the metal-containing bonding layer is not formed in the via hole, so good electrical contact can be achieved between wiring patterns through the via even when a material of low conductivity is used for the metal-containing bonding layer.

The metal-containing bonding layer may preferably comprise a metal compound containing a metal selected from the group consisting of chromium, copper, nickel, cobalt, and zinc. Even more preferably, the metal compound is an oxide or a hydroxide of a metal selected from the group consisting of chromium, copper, nickel, cobalt, and zinc. These metal compounds improve the adhesive of the conductor material that makes up the wiring pattern to the resin material that makes up the insulating layer. Preferably, the metal-containing bonding layer is provided in a coverage of at least 10% with respect to the insulating layer. It is also preferable if the metal-containing bonding layer has a thickness of 0.01 to 1.0 µm. This ensures the proper thinness of the wiring structure or multilayer wiring board.

The support is pressed onto the insulating layer in the step of sticking on the support. It is also preferable if the step of sticking on the support is performed under heating. These both facilitate the step of sticking the support onto the insulating layer.

Preferably, the support may comprise a metal material selected from the group consisting of copper, aluminum, copper alloys, and aluminum alloys. It is also preferable if the surface roughness of the support is 5 µm or less, and more preferable if it is 3 µm or less. "Surface roughness" as used herein refers to the so-called maximum height roughness ($R_{max}$), which is the sum of the maximum value for peak height (the absolute value from the standard value) and the maximum value for valley depth (the absolute value from the standard value) along a standard length of a roughness curve expressing the cross sectional shape of the material surface.

With a conventional multilayer wiring board, from the standpoint of increasing adhesion between the insulating layer and the wiring pattern laminated thereto, the surface roughness of the insulating layer in contact with the wiring pattern was relatively high, with about 5 µm being actively achieved with a roughening treatment. The adhesion of the wiring pattern to the insulating layer was ensured by the physical anchoring effect based on this high surface roughness, or more specifically the bumpy texture of the surface. In contrast, with the present invention, even in situations in which the surface roughness is less than 5 µm and almost no anchoring effect can be anticipated, the adhesion of the wiring pattern to the insulating layer is increased by the interposition of the coupling agent and the metal-containing bonding layer provided over the insulating layer by transfer from the support.

Preferably, the insulating layer includes a thermosetting resin, is in an incompletely cured state prior to the step of sticking on the support, and is cured in the step of sticking on the support. This, along with the bonding of the coupling agent and the metal-containing bonding layer to the insulating layer, allows the insulating layer to be cured and makes the manufacture of a multilayer wiring board more efficient.

The present invention also provides a multilayer wiring board which comprises a substrate, a first wiring pattern formed on a surface of the substrate, an insulating layer formed on said surface of the substrate to cover the first wiring pattern, and a second wiring pattern formed on the insulating layer and spaced from the first wiring pattern. A coupling agent is interposed between the second wiring pattern and the insulating layer. Such a multilayer wiring board structured can be manufactured by the methods according to the first and third aspects of the present invention.

Preferably, the multilayer wiring board may additionally comprise a metal-containing bonding layer between the coupling agent and the wiring pattern. Such a multilayer wiring board can be manufactured by the methods pertaining to the second and fourth aspects of the present invention. Therefore, the same benefits can be obtained as those listed above for the second and fourth aspects in terms of the adhesion of the wiring pattern to the insulating layer.

Examples of the insulating layer used in the present invention include polyimide resins, epoxy resins, maleimide resins, bismaleimide resins, cyanate resins, polyphenylene ether resins, polyphenylene oxide resins, olefin resins, fluororesins, liquid crystal polymers, polyether imide resins, and polyether ether ketone resins.

The coupling agent can be a silane-based coupling agent or titanium-based coupling agent, for example. Examples of silane-based coupling agents that can be used include amino-based silane coupling agents, epoxy-based silane coupling agents, and silane coupling agents having imidazole groups, dialkylamino groups, pyridyl groups, or the like. More specific examples include γ-glycidoxypropyl trimethoxy silane, γ-glycidoxypropyl triethoxy silane, γ-methacryloxypropyl trimethoxy silane, γ-methacryloxypropyl triethoxy silane, vinyltrichloro silane, vinyltris(2-methoxyethoxy) silane, β-(3,4-epoxycyclohexyl)ethyl trimethoxy silane, γ-aminopropyl triethoxy silane, N-phenyl-γ-aminopropyl trimethoxy silane, γ-chloropropyl trimethoxy silane, and γ-mercaptopropyl trimethoxy silane.

Meanwhile, examples of titanate-based coupling agents include isopropyltriisostearoyl titanate,

| isopropyltridecylbenzenesulfonyl | titanate, |
| isopropyltris(dioctylpyrophosphate) | titanate, |
| tetraisopropylbis(dioctyiphosphite) | titanate, | tetraoctylbis(ditridecylphosphite) titanate, tetra(2,2-diallyloxymethyl-1-butyl)bis(di-tridecyl)phosphite titanate, bis(dioctylpyrophosphate)oxyacetate titanate,

| bis(dioctylpyrophosphate)ethylene | titanate, |
| isopropyltrioctanoyl | titanate, |
| isopropyldimethacrylisostearoyl | titanate, |
| isopropylisostearoyldiacryl | titanate, |
| isopropyltri(dioctylphosphate) | titanate, | isopropyltricumylphenyl titanate, and isopropyltri(N-aminoethyl-aminoethyl) titanate.

A substrate selected from the group consisting of resin substrates, ceramic substrates, glass substrates, silicon substrates, and metal substrates is used as the supporting substrate is preferably used as the supporting substrate in the present invention. The desired number of insulating layers and wiring patterns are formed on one or both sides of this supporting substrate.

Other objects, features and advantages of the present invention will become clearer from the following description of the preferred embodiments given with reference to the accompanying drawings.

BRIEF DESCRIPTION OF THE DRAWINGS

FIGS. 3a through 3l are views illustrating the successive process steps of manufacturing the multilayer wiring board shown in FIG. 1.

FIGS. 6a through 6l are views illustrating the successive process steps of manufacturing the multilayer wiring board shown in FIG. 4.

DESCRIPTION OF THE PREFERRED EMBODIMENTS

Figure 1:
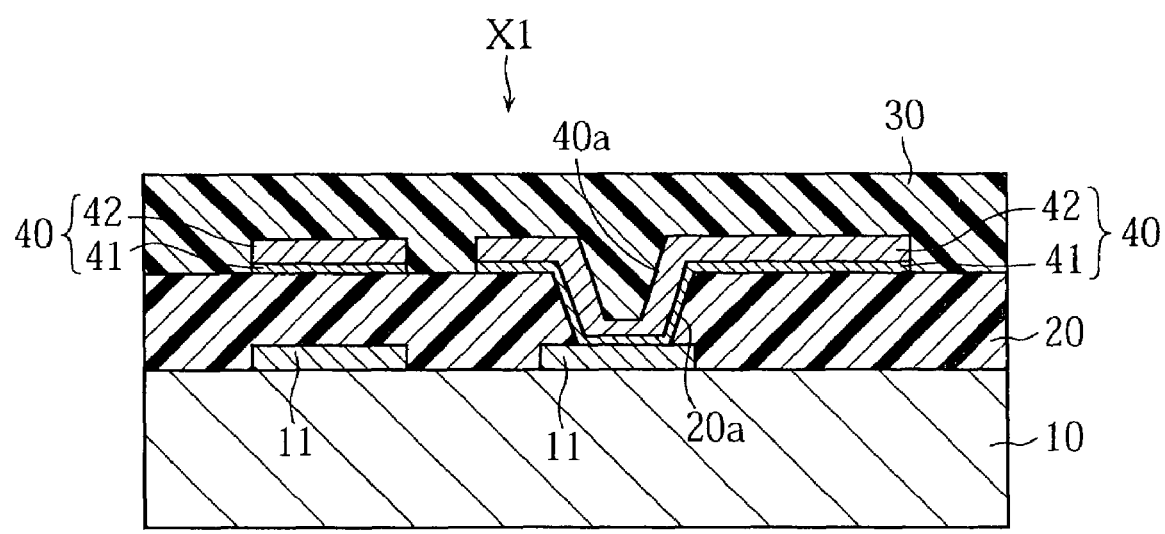
FIG. 1 is a partial sectional view showing a multilayer wiring board according to a first embodiment of the present invention.
Figure 2:
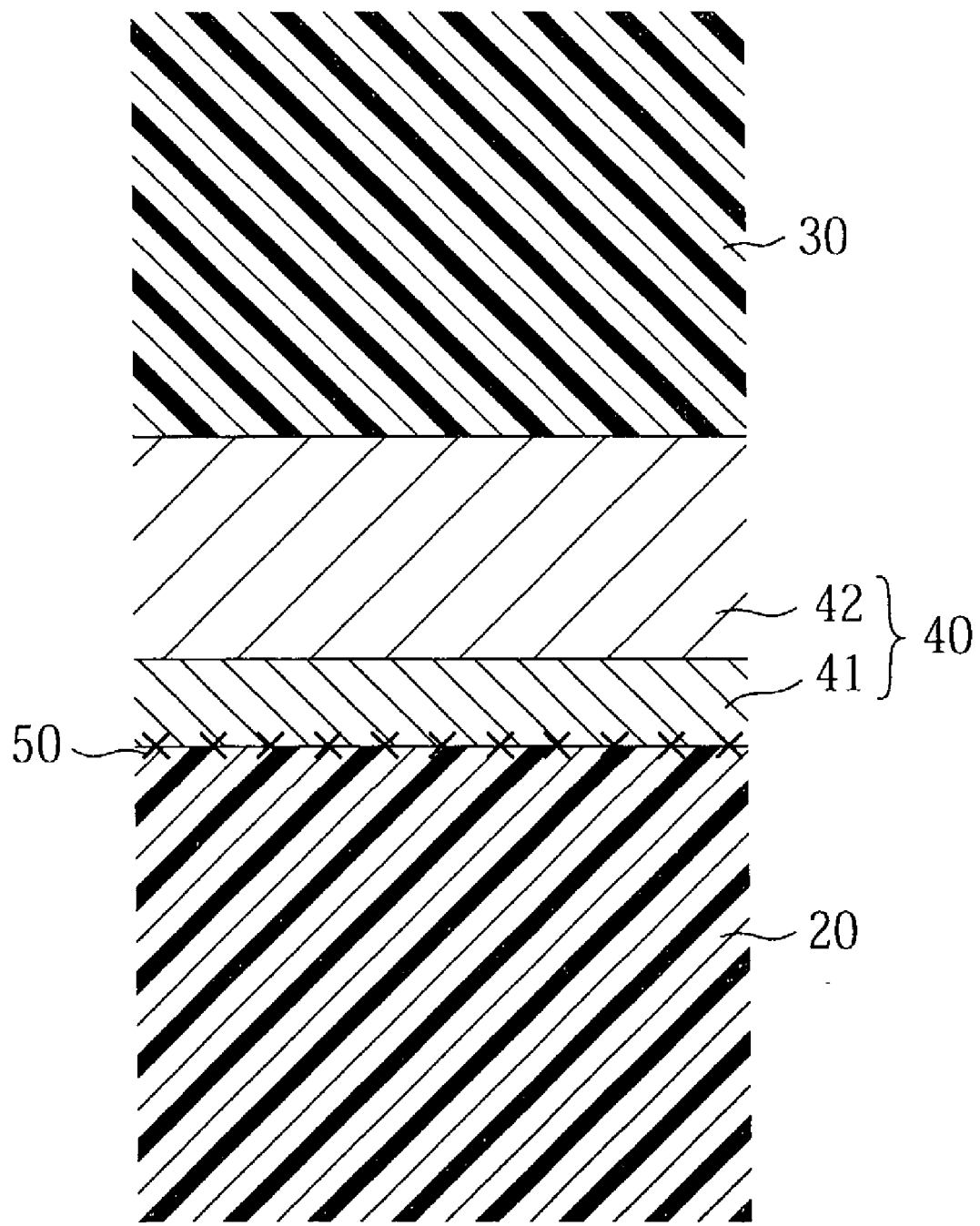
FIG. 2 is a fragmentary sectional view illustrating a main portion of the multilayer wiring board shown FIG. 1.

FIG. 1 is a partial cross section of a multilayer wiring board X1 pertaining to a first embodiment of the present invention. FIG. 2 is a detail cross section of the main portion of the same multilayer wiring board X1. The multilayer wiring board X1 comprises a core substrate 10, insulating resin layers 20 and 30 laminated thereon, and a wiring pattern 40 embedded between the insulating resin layer 20 and the insulating resin layer 30. A coupling agent 50 is interposed between the wiring pattern 40 and the insulating resin layer 20, as indicated by the X's in FIG. 2.

The core substrate 10 is produced by stacking a plurality of prepregs in a B-stage state, each prepreg being prepared by impregnating a glass cloth with a resin. An inner layer wiring pattern 11 is formed from copper on the surface of the core substrate 10.

Examples of the material that makes up the insulating resin layers 20 and 30 include polyimide resins, epoxy resins, maleimide resins, bismaleimide resins, cyanate resins, polyphenylene ether resins, polyphenylene oxide resins, olefin resins, fluororesins, liquid crystal polymers, polyether imide resins, and polyether ether ketone resins. With the multilayer wiring board X1 shown in FIG. 1, a via hole 20a is formed in the insulating resin layer 20.

The wiring pattern 40 is formed on the insulating resin layer 20 and comprises an electroless copper plating layer 41 and a copper electroplating layer 42. The wiring pattern 40 and the inner layer wiring pattern 11 are electrically connected through a via 40a formed in the via hole 20a.

The coupling agent 50 increases the adhesion of the wiring pattern 40 to the insulating resin layer 20 by being interposed between the insulating resin layer 20 and the wiring pattern 40. A silane-based coupling agent or titanium-based coupling agent is used as the coupling agent 50.

Figure 3E:
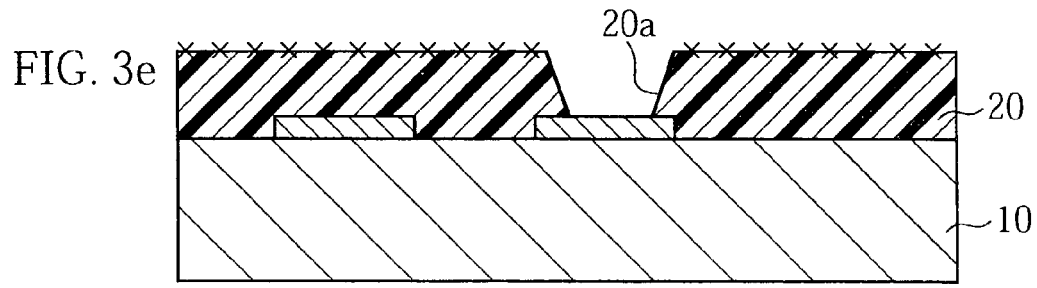

FIGS. 3a through 3l illustrate the successive process steps for manufacturing the multilayer wiring board X1 shown in FIG. 1. In the manufacture of the multilayer wiring board X1, first, as shown in FIG. 3a, the surface of a support film 70 is treated with the coupling agent 50. Specifically, the support film 70 is readied with a surface roughness of 5 μm or less, and this surface is either coated with or dipped in a solution of the coupling agent 50 and then heated and dried. This causes the coupling agent 50 to adhere to the specified surface of the support film 70. It is preferable to use a metal film such as a copper foil or aluminum foil as this support film 70. The coupling agent 50 is able to adhere to this metal film with good orientation and efficiency through functional groups capable of bonding with an inorganic material (—OR: hydroxyl group, methoxy group, ethoxy group, etc.).

Next, as shown in FIGS. 3b and 3c, an uncured insulating resin layer 20' that will eventually become the insulating resin layer 20 of the multilayer wiring board X1 is laminated over the core substrate 10 on which the inner layer wiring pattern 11 has already been formed. The support film 70 that has been treated with the coupling agent 50 is laid over this so as to touch the insulating resin layer 20', and these are stuck together. The inner layer wiring pattern 11 has already undergone a roughening treatment so as to obtain an anchor effect with the insulating resin layer 20. Here, depending on the properties of the resin material that makes up the insulating resin layer 20', these components may be stuck together under heating, or the support film 70 may be pressed against the insulating resin layer 20'. When such heating is performed, the insulating resin layer 20' may be solidified or cured by this heating, so that the insulating resin layer 20 is formed at the same time. If there is no need to heat the support film 70, then a heating step for solidifying or curing the insulating resin layer 20' is carried out separately to form the insulating resin layer 20.

Next, as shown in FIG. 3d, just the support film 70 is removed by etching or another such treatment while leaving the coupling agent 50 behind on the insulating resin layer 20. This results in the coupling agent 50 being uniformly transferred onto the surface of the insulating resin layer 20. If a copper foil, aluminum foil, or other such metal film is used as the support film 70, the etching can be carried out more favorably if an etching solution corresponding to these is used. For a copper foil, for instance, a hydrogen peroxide-sulfuric acid mixed aqueous solution or a cupric chloride aqueous solution can be used as the etching solution. Also, hydrochloric acid, for example, can be used on an aluminum foil.

Next, as shown in FIG. 3e, the via hole 20a is formed at a specific location in the insulating resin layer 20 to which the coupling agent 50 has been transferred. The means for forming the via hole 20a can be a carbon dioxide laser, an excimer laser, a UV-YAG laser, or the like. When the via hole 20a is formed by one of these lasers, a fine pebbled texture is formed on the inner wall of the via hole 20a, and a sufficient anchor effect is obtained between the inner wall of the via hole 20a and the via 40a formed in contact therewith.

Figure 3F:
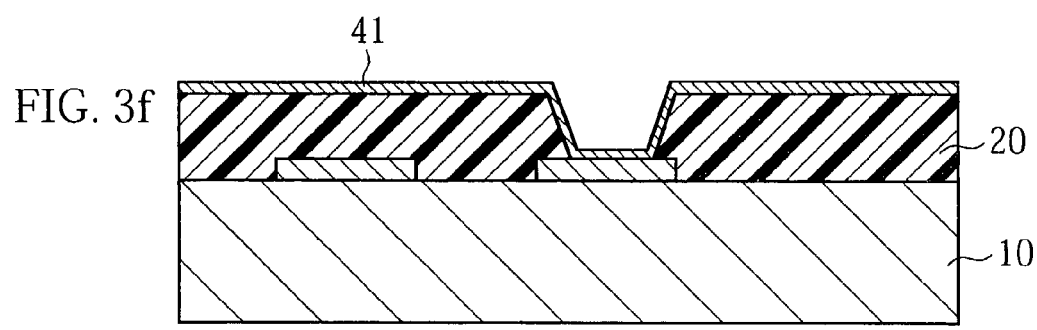

Next, as shown in FIG. 3f, the insulating resin layer 20 is subjected to an electroless copper plating treatment from above the coupling agent 50, which forms the electroless copper plating layer 41 having a thickness of 0.05 to 0.5 μm. A known method can be employed for this electroless copper plating, such as one including a series of steps such as subjecting the exposed surface of the insulating resin layer 20 to conditioning, catalyst pretreatment, catalyst treatment, reaction acceleration treatment, and electroless copper plating deposition treatment. The electroless copper plating layer 41 covers the entire surface over the insulating resin layer 20, and functions as an electroconductive layer in the subsequent step of electroplating. For the sake of simplicity, the coupling agent 50 is not illustrated in FIGS. 3f through 3l.

Figure 3G:
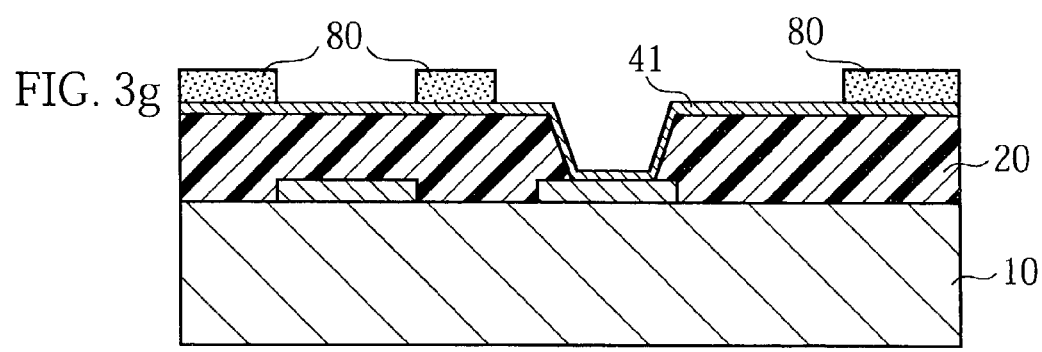

Next, as shown in FIG. 3g, a resist pattern 80 is formed over the electroless copper plating layer 41. Specifically, a photoresist is laminated over the electroless copper plating layer 41, and this photoresist is patterned by exposure and developing according to the desired pattern, thereby forming the resist pattern 80.

Figure 3H:
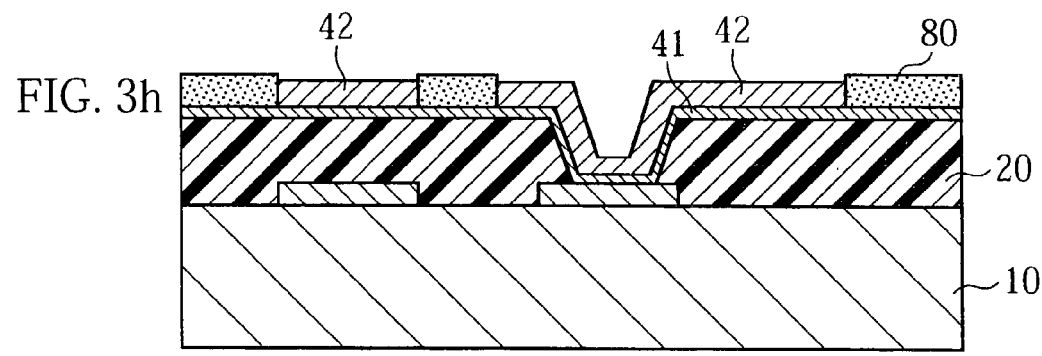

Next, as shown in FIG. 3h, a copper electroplating treatment is performed using the electroless copper plating layer 41 as an electroconductive layer. As a result, the copper electroplating layer 42 is deposited in a thickness of 10 to 30 μm in the non-mask region of the resist pattern 80. A known method that makes use of an acidic copper sulfate plating solution can be employed for this copper electroplating. For example, this acidic copper sulfate plating solution can be one containing 50 to 100 g/L copper sulfate pentahydrate, 150 to 300 g/L sulfuric acid, 30 to 100 mg/L chlorine ions, and a gloss agent, smoothing agent, or other such additives in a concentration of 0.1 to 2%. The current density during electrolysis is preferable from 0.5 to 5 A/dm$^2$.

Next, as shown in FIG. 3i, the resist pattern 80 is stripped. A sodium hydroxide aqueous solution or an organic amine-based aqueous solution can be used as the stripping solution. Next, as shown in FIG. 3j, the electroless copper plating layer 41 not covered by the copper electroplating layer 42 is removed. More specifically, the electroless copper plating layer 41 is etched away with a mixed aqueous solution of hydrogen peroxide and sulfuric acid or a cupric chloride aqueous solution, for example. As a result, the wiring pattern 40 composed of the electroless copper plating layer 41 and the copper electroplating layer 42 is formed on the insulating resin layer 20 with the coupling agent 50 (not shown in FIG. 3j) interposed therebetween. In this state, the surface of the copper electroplating layer 42 of the wiring pattern 40 is subjected to a roughening treatment in order to obtain an anchor effect with the subsequently formed insulating resin layer 30.

Next, as shown in FIG. 3k, the insulating resin layer 30 is formed on the insulating resin layer 20 from above the wiring pattern 40. This forms the multilayer wiring board X1 shown in FIG. 1.

FIG. 3d illustrates a multilayer wiring board X1' after the series of steps from the transfer of the coupling agent 50 onto the insulating resin layer 20 up to the formation of the insulating resin layer 30 through the formation of the wiring pattern 40 has been repeated again on the insulating resin layer 30. Thus repeating this series of steps the required number of times allows the desired number of laminations to be obtained.

Figure 4:
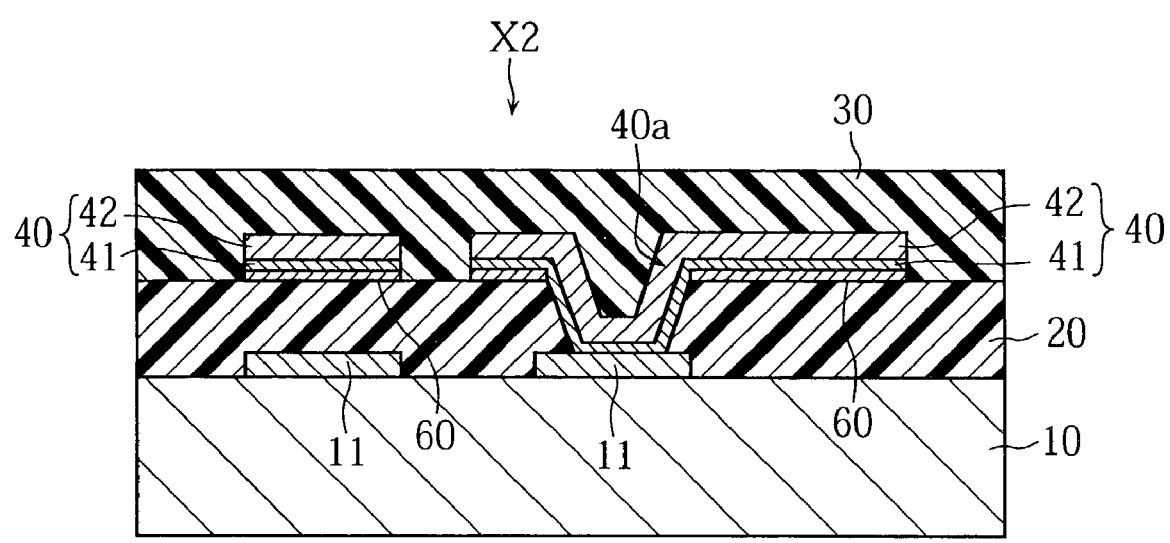
FIG. 4 is a partial sectional view showing a multilayer wiring board according to a second embodiment of the present invention.
Figure 5:
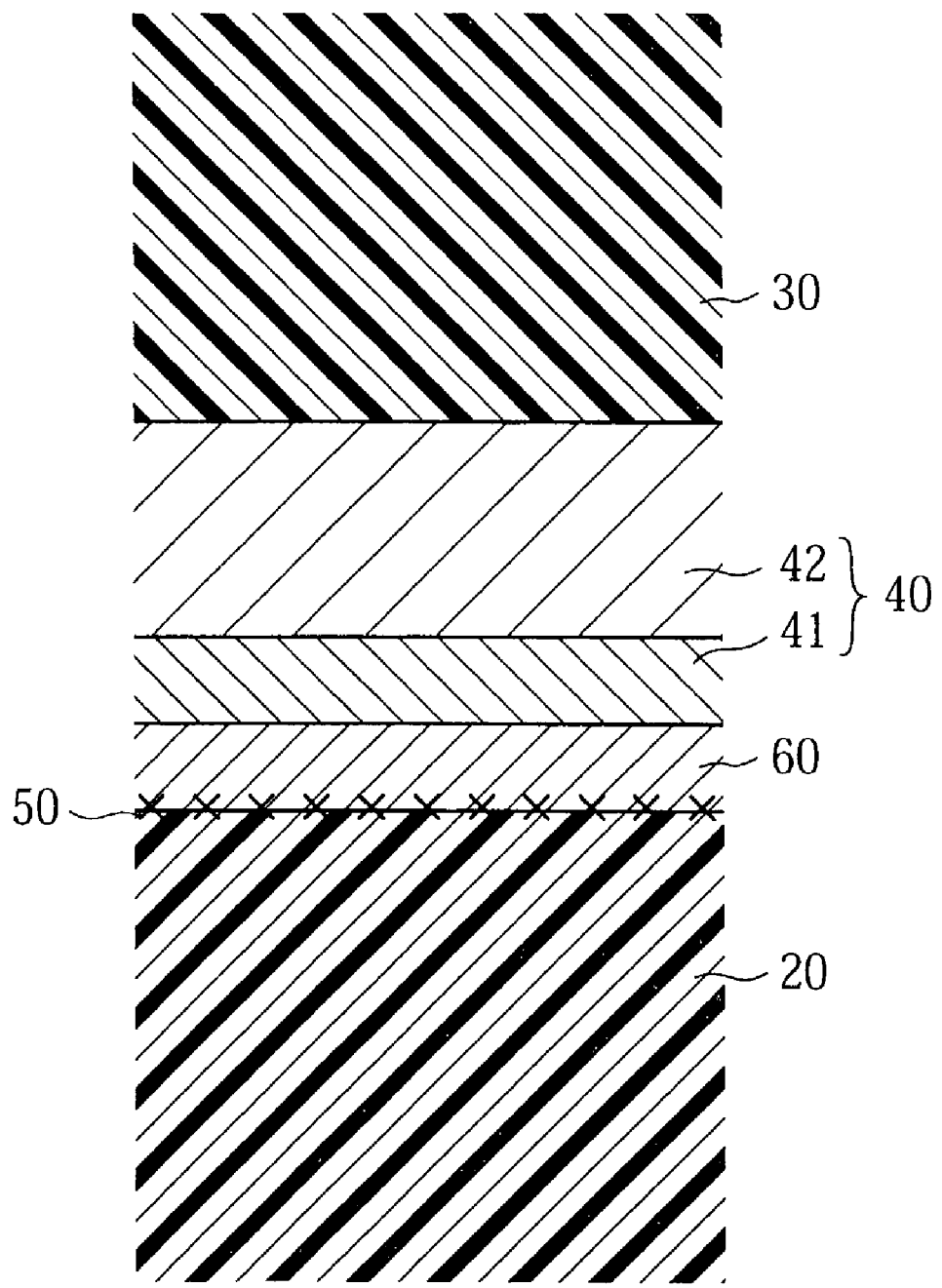
FIG. 5 is a fragmentary sectional view illustrating a main portion of the multilayer wiring board shown FIG. 4.

FIG. 4 is a partial cross section of a multilayer wiring board X2 pertaining to a second embodiment of the present invention. FIG. 5 is a detail cross section of the main portion of the multilayer wiring board X2. The multilayer wiring board X2 comprises the core substrate 10, insulating resin layers 20 and 30 laminated thereon, and the wiring pattern 40 embedded between the insulating resin layers 20 and 30. The coupling agent 50 (indicated by X's in FIG. 5) and a metal-containing bonding layer 60 are interposed between the wiring pattern 40 and the insulating resin layer 20. The multilayer wiring board X2 differs from the multilayer wiring board X1 in the first embodiment in that the metal-containing bonding layer is interposed in addition to the coupling agent 50 between the wiring pattern 40 and the insulating resin layer 20.

The metal-containing bonding layer 60 is interposed between the insulating resin layer 20 that has been surface treated with the coupling agent 50 and the wiring pattern 40 in a thickness of 0.01 to 1.0 μm, which gives the wiring pattern 40 adhesion to the insulating resin layer 20. Materials that can be used for the metal-containing bonding layer 60 include chromium, titanium, nickel, cobalt, and zinc, as well as oxides and hydroxides of these. The metal-containing bonding layer 60 is not formed in the via hole 20a of the insulating resin layer 20.

Figure 6A:

FIGS. 6a through 6l illustrates the steps involved in manufacturing the multilayer wiring board X2 shown in FIG. 4. First, as shown in FIG. 6a, the metal-containing bonding layer 60 is formed on the surface of the support film 70, after which the surface of the metal-containing bonding layer 60 is treated with the coupling agent 50. More specifically, the support film 70 is readied with a surface roughness of 5 μm or less, and on this surface is formed the metal-containing bonding layer 60, in a thickness of 0.01 to 1.0 μm, by a wet process such as plating or by a dry process such as sputtering or vacuum vapor deposition, with this layer containing chromium, titanium, nickel, cobalt, zinc, or the like as a constituent material. It is particularly favorable to form this layer by a chromating treatment using an aqueous solution containing chromic acid or a dichromate. The surface of the metal-containing bonding layer 60 is then either coated with or dipped in a solution of the coupling agent 50 and then heated and dried. This causes the coupling agent 50 to adhere to the specified surface of the metal-containing bonding layer 60 of the support film 70. It is preferable to use a metal film as this support film 70 as discussed above in the first embodiment.

Figure 6B:
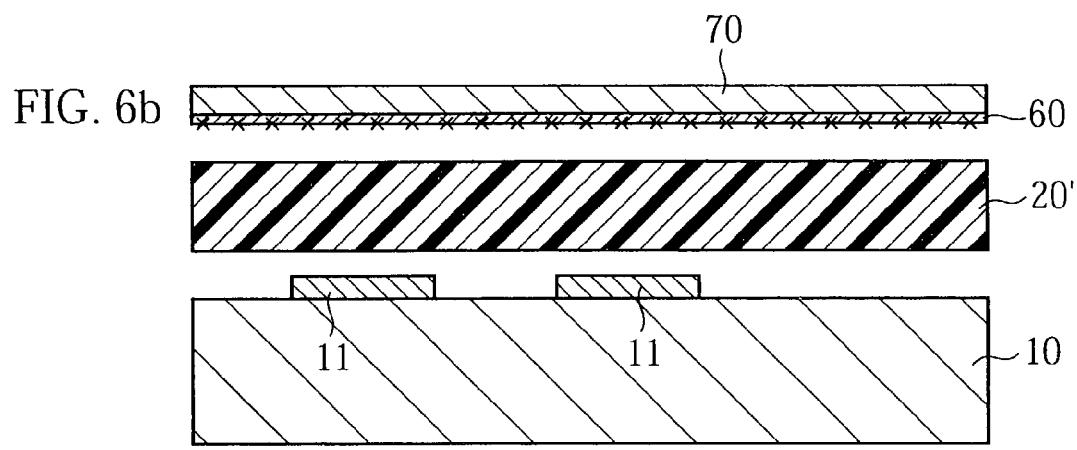
Figure 6C:
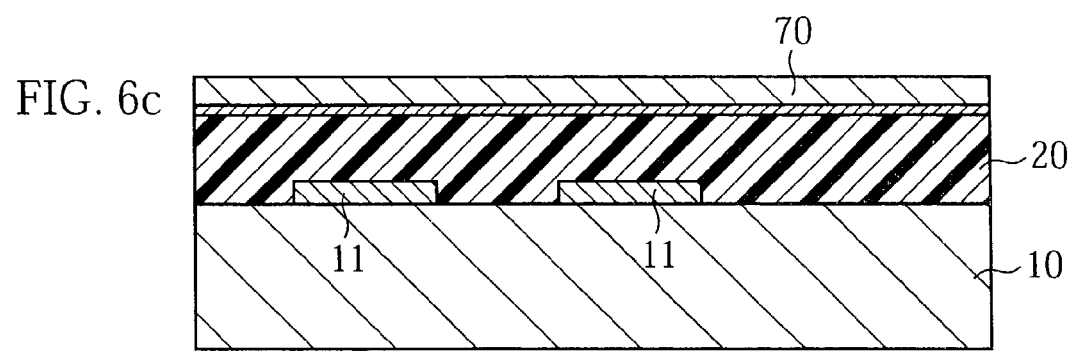
Figure 6D:
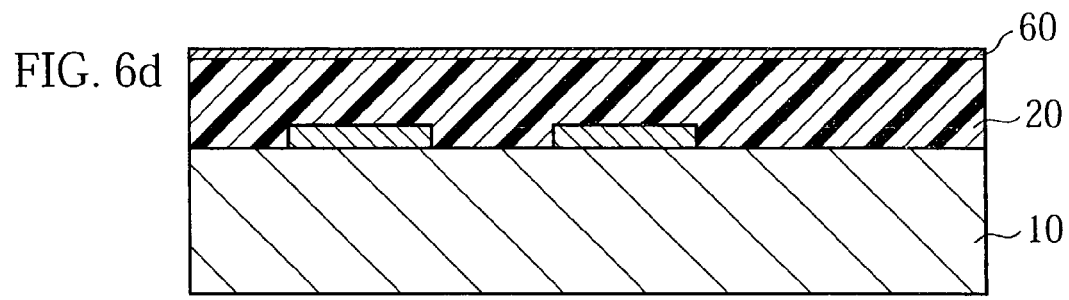

Next, as shown in FIGS. 6b and 6c, the core substrate 10 on which the inner layer wiring pattern 11 has been formed, the uncured insulating resin layer 20', and the support film 70 on which the metal-containing bonding layer 60 has been formed and that has been treated with the coupling agent 50 are stuck together. For the sake of simplicity, the coupling agent 50 is not illustrated in the step diagrams from FIGS. 6c through 6l. Next, as shown in FIG. 6d, just the support film 70 is removed by etching or another such treatment while leaving the coupling agent 50 and the metal-containing bonding layer 60 behind on the insulating resin layer 20. This transfers the coupling agent 50 and the metal-containing bonding layer 60 to the surface of the insulating resin layer 20.

Figure 6E:
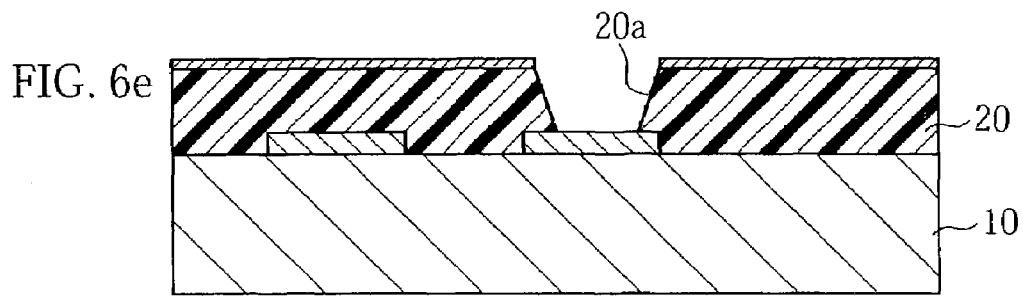
Figure 6F:
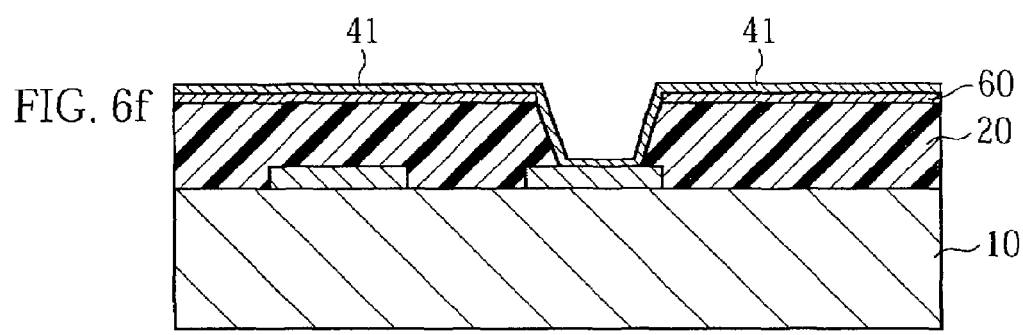
Figure 6G:
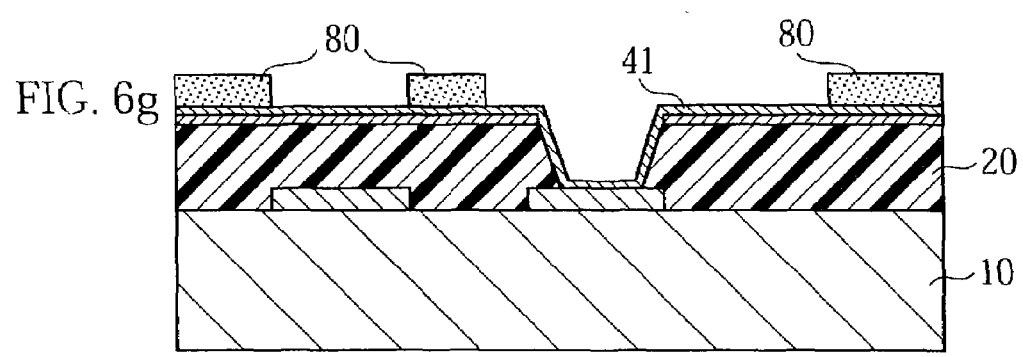

Next, as shown in FIG. 6e, the via hole 20a is formed at a specific location in the insulating resin layer 20 where the coupling agent 50 and the metal-containing bonding layer 60 have already been transferred. The means for forming the via hole 20a can be a carbon dioxide laser, an excimer laser, a UV-YAG laser, or the like. Next, as shown in FIG. 6f, just as discussed above in the first embodiment, an electroless copper plating treatment is performed from above the coupling agent 50 and the metal-containing bonding layer 60 to form the electroless copper plating layer 41 in a thickness of 0.05 to 0.5 μm. Even if the metal-containing bonding layer 60 does not cover the entire surface of the insulating resin layer 20, the electroless copper plating layer 41 formed by this electroless copper plating treatment will cover the entire surface of the insulating resin layer 20 and function as an electroconductive layer in the subsequent step of electroplating. However, if a metal-containing bonding layer 60 formed from a conductive material is laminated over the entire surface, this metal-containing bonding layer 60 is able to function as an electroconductive layer. Next, as shown in FIG. 6g, the resist pattern 80 is formed over the electroless copper plating layer 41. Specifically, a photoresist is laminated over the electroless copper plating layer 41, and this photoresist is patterned by exposure and developing according to the desired pattern.

Figure 6H:
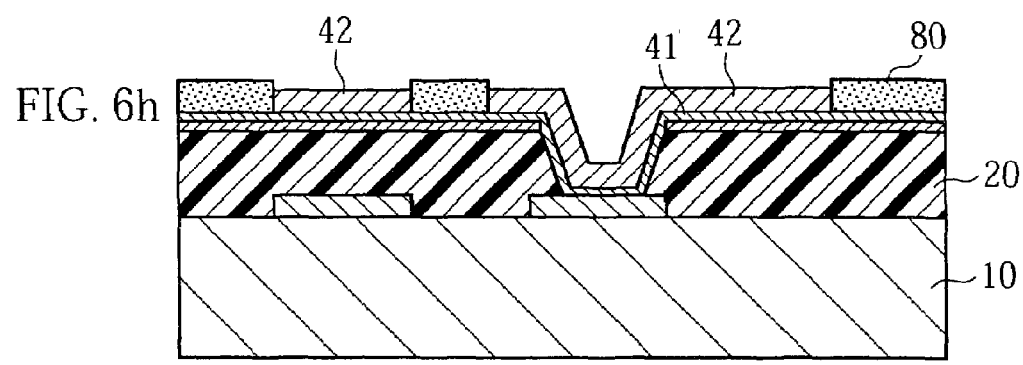
Figure 7:
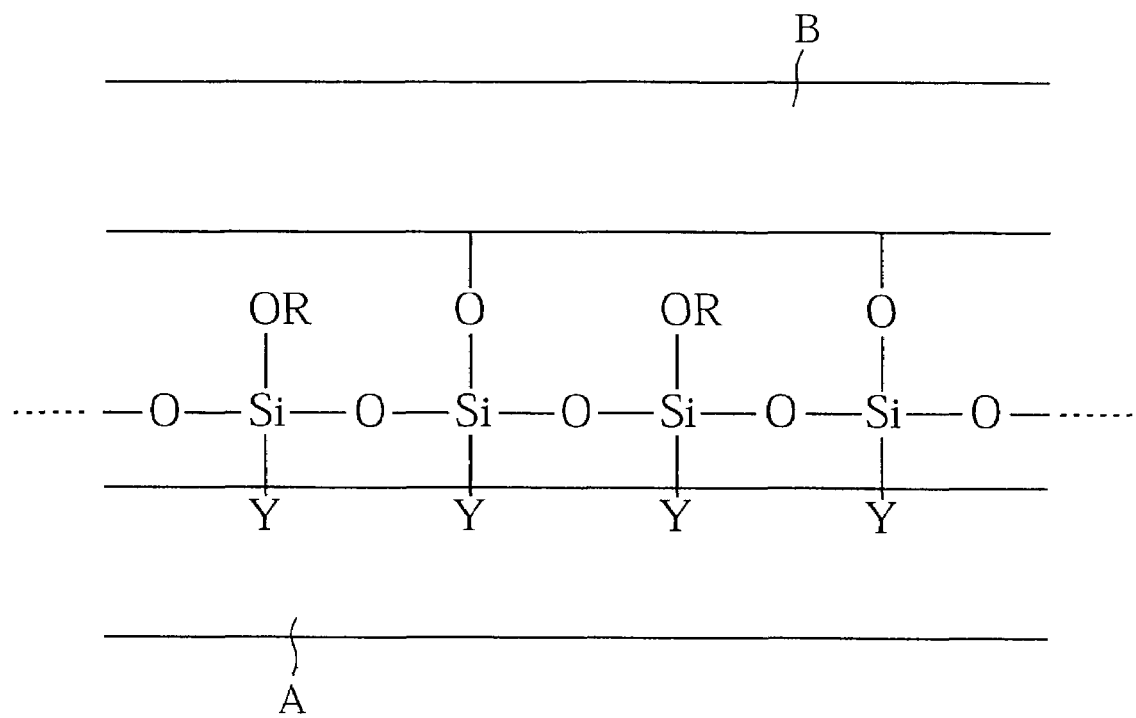
FIG. 7 is a schematic view showing the structure of a coupling agent interposed between an organic material and an inorganic material.

Next, as shown in FIG. 6h, just as discussed above in the first embodiment, a copper electroplating treatment is performed using the electroless copper plating layer 41 as an electroconductive layer. As a result, the copper electroplating layer 42 is deposited in a thickness of 10 to 30 μm in the non-mask region of the resist pattern 80.

Next, as shown in FIG. 6i, the resist pattern 80 is stripped. A sodium hydroxide aqueous solution or an organic amine-based aqueous solution can be used as the stripping solution. Next, as shown in FIG. 6j, the electroless copper plating layer 41 not covered by the copper electroplating layer 42 is removed along with the underlying metal-containing bonding layer 60. Specifically, the electroless copper plating layer 41 is etched away with a mixed aqueous solution of hydrogen peroxide and sulfuric acid or a cupric chloride aqueous solution, for example, and then the metal-containing bonding layer 60 is etched away with an ammonium ceric nitrate aqueous solution, for example. As a result, the wiring pattern 40 composed of the electroless copper plating layer 41 and the copper electroplating layer 42 is formed on the insulating resin layer 20 with the coupling agent 50 and the metal-containing bonding layer 60 interposed therebetween. In this state, the surface of the copper electroplating layer 42 of the wiring pattern 40 is subjected to a roughening treatment in order to obtain an anchor effect with the subsequently formed insulating resin layer 30. Next, as shown in FIG. 6k, the insulating resin layer 30 is formed on the insulating resin layer 20 from above the wiring pattern 40. This forms the multilayer wiring board X2 shown in FIG. 4. FIG. 6l illustrates a multilayer wiring board X2' after the series of steps from the transfer of the coupling agent 50 onto the insulating resin layer 20 up to the formation of the insulating resin layer 30 through the formation of the wiring pattern 40 by transfer from the coupling agent 50 has been repeated again on the insulating resin layer 20. Thus repeating this series of steps the required number of times allows the desired number of laminations to be obtained. The remaining conditions for the manufacture of the multilayer wiring board X2 illustrated in FIGS. 6a through 6l are the same as given above in the first embodiment of FIGS. 3a through 3l.

In the above first and second embodiments of the present invention, the multilayer wiring structure was formed only on one side of the core substrate 10, but the present invention is not limited to this configuration, and a multilayer wiring structure can also be formed on both sides of the core substrate 10.

EXAMPLES

Examples of the present invention will now be described along with comparative examples.

Example 1

Production of Sample Substrate

A copper foil (thickness: 18 μm; surface roughness ($R_{max}$): 1 μm) used as a support film was dipped in a 0.4% γ-glycidoxypropyl trimethoxy silane aqueous solution used as a coupling agent, after which this product was dried for 60 minutes at 110° C., thereby subjecting the surface of this copper foil to a coupling agent treatment. Next, a thermoplastic polyimide film (thickness: 35 µm; trade name: Espanex, made by Nippon Steel Chemical) used as an insulating resin layer was laid over the copper surface of a copper-clad BT resin substrate (100×100×1.6 mm, made by Mitsubishi Gas Chemical) used as a core substrate, and these components were pressed for 60 minutes in a vacuum press at a pressing temperature of 210° C. and a pressure of 3 MPa. The copper foil used as the support film was then etched away with a mixed aqueous solution of hydrogen peroxide and sulfuric acid, which transferred the coupling agent to the insulating resin layer surface.

Next, an electroless copper plating film (thickness: 0.3 µm) was formed over the entire surface of the insulating resin layer onto which the coupling agent had been transferred. A Cuposit process (made by Shipley), in which the object being plated is successively immersed in the following treatment solutions, was employed in the formation of the electroless copper plating film. Specifically, the insulating resin layer surface was conditioned for 5 minutes at 40° C. with Conditioner 3320, then subjected to a catalyst pretreatment for 90 seconds at room temperature with a Cataprep 404 aqueous solution, subjected to a catalyst treatment for 3 minutes at 45° C. with a mixed aqueous solution of Cataprep 404 and Cataposit 44, subjected to a reaction acceleration treatment for 6 minutes at room temperature with an Accelerator 19 aqueous solution, and finally subjected to an electroless copper plating deposition treatment for 20 minutes at room temperature with a Copper Mix 328 aqueous solution.

Next, a copper electroplating film (thickness: 30 µm) is formed over the electroless copper plating film formed as above using this electroless copper plating film as an electroconductive layer. The copper electroplating solution was produced by adding an additive (trade name: AC-90, made by C. Uemura) to an aqueous solution containing 75 g/L copper sulfate pentahydrate, 190 g/L sulfuric acid, 60 mg/L chlorine ions, in an amount such that the concentration with respect to the overall plating solution would be 0.4%. The electrolysis was conducted at a current density of 1.5 A/dm$^2$. As a result, a copper plating film was formed as a wiring pattern over the polyimide serving as the insulating resin layer. An annealing treatment was then performed for 1 hour at 170° C., after which the copper plating film was cut into pieces 1 cm wide. The sample substrate in this example was produced as above.

Measurement of Peel Strength

The peel strength was measured for a copper plating film on a sample substrate obtained as above. Specifically, a copper plating film 1 cm wide on the sample substrate was peeled perpendicular to the substrate (perpendicular to the width direction), and the force acting on the copper plating film was measured at a constant peel rate. As a result, the copper plating film in this example exhibited a peel strength of 1.15 kgf/cm with respect to the polyimide resin. Also, the surface roughness of the insulating resin layer was examined after the copper plating film had been peeled off, which revealed the surface roughness to be an $R_{max}$ of 1 µm.

Example 2

Other than using a copper foil with a surface roughness $R_{max}$ of 5 µm instead of the copper foil with a surface roughness $R_{max}$ of 1 µm as the support film, a sample substrate was produced by the same method as in Example 1. The peel strength of the copper plating film on this sample substrate was measured in the same manner as in Example 1. As a result, the copper plating film in this example exhibited a peel strength of 1.25 kgf/cm with respect to the polyimide resin. The surface roughness $R_{max}$ of the insulating resin layer after peeling was 5 µm.

Example 3

Production of Sample Substrate

An aluminum foil (thickness: 25 µm; surface roughness ($R_{max}$): 2 µm) used as a support film was dipped in a 0.4% γ-methacryloxypropyl methoxy silane aqueous solution used as a coupling agent, after which this product was dried for 20 minutes at 100° C., thereby subjecting the surface of this aluminum foil to a coupling agent treatment. Next, a semi-cured (B stage) thermosetting epoxy resin sheet (thickness: 50 µm; trade name: SH-9, made by Ajinomoto) used as an insulating resin layer was laid over the copper surface of a copper-clad BT resin substrate (100×100×1.6 mm, made by Mitsubishi Gas Chemical) used as a core substrate. The above-mentioned aluminum foil that had undergone the coupling agent surface treatment was laid over this copper-clad BT resin substrate such that the coupling agent treated side was in contact with the epoxy resin, and these components were laminated for 3 minutes in a vacuum laminator at a temperature of 150° C. and a pressure of 1 MPa. After this, the laminate composed of the copper-clad BT resin substrate and the aluminum foil was taken out of the vacuum laminator and heated for 1 hour at 170° C. under atmospheric pressure, which cured the insulating resin layer. The aluminum foil used as the support film was then etched away with hydrochloric acid, which transferred the coupling agent to the insulating resin layer surface. Next, an electroless copper plating film (thickness: 0.3 µm) was formed in the same manner as in Example 1 over the entire surface of the insulating resin layer onto which the coupling agent had been transferred. An electroplated copper film (thickness: 30 µm) was then formed in the same manner as in Example 1 over this electroless copper plating film, using the electroless copper plating film as the electroconductive layer. As a result, a copper plating film was formed as a wiring pattern over the epoxy resin serving as the insulating resin layer. An annealing treatment was then performed for 1 hour at 170° C., after which the copper plating film was cut into pieces 1 cm wide. The sample substrate in this example was produced as above.

Measurement of Peel Strength

The peel strength was measured in the same manner as in Example 1 for a copper plating film on a sample substrate obtained as above. Specifically, a copper plating film 1 cm wide on the sample substrate was peeled perpendicular to the substrate (perpendicular to the width direction), and the force acting on the copper plating film was measured at a constant peel rate. As a result, the copper plating film in this example exhibited a peel strength of 1.0 kgf/cm with respect to the polyimide resin. Also, the surface roughness of the insulating resin layer was examined after the copper plating film had been peeled off, which revealed the surface roughness to be an $R_{max}$ of 2 µm.

Example 4

A copper foil (thickness: 18 µm; surface roughness ($R_{max}$): 1 µm) used as a support film was dipped in an aqueous solution containing 0.3% γ-glycidoxypropyl trimethoxy silane and 0.3% γ-methacryloxypropyl methoxy silane and used as a coupling agent, after which this product was dried for 20 minutes at 120° C., thereby subjecting the surface of this copper foil to a coupling agent treatment. Next, an uncured polyimide film (thickness: 25 μm; trade name: Apical, made by Kanegabuchi Chemical Industry) used as an insulating resin layer was laid over the copper surface of a copper-clad BT resin substrate (100×100×1.6 mm, made by Mitsubishi Gas Chemical) used as a core substrate. The above-mentioned copper foil that had undergone the coupling agent surface treatment was laid over this copper-clad BT resin substrate such that the coupling agent treated side was in contact with the polyimide, and these components were laminated for 10 minutes in a vacuum laminator at a temperature of 180° C. and a pressure of 0.8 MPa. After this, the laminate composed of the copper-clad BT resin substrate and the copper foil was taken out of the vacuum laminator and heated for 30 minutes at 210° C. under atmospheric pressure, which cured the insulating resin layer. The copper foil used as the support film was then etched away with a cupric chloride aqueous solution, which transferred the coupling agent to the insulating resin layer surface. Next, a via hole with a diameter of 80 μm was formed in the insulating resin layer with a carbon dioxide laser in order to achieve electrical conduction to the wiring pattern. An electroconductive layer was then formed by electroless copper plating in the same manner as in Example 1 over the insulating resin layer onto which the coupling agent had been transferred. Next, a photoresist (trade name: NIT-250, made by Nichigo-Morton) was formed over the electroconductive layer, and this was patterned to form a resist pattern. A copper electroplating layer was deposited in a thickness of 30 μm in the same manner as in Example 1 on the non-mask region of this resist pattern. The resist pattern was then peeled off. Next, the electroconductive layer not covered with the copper electroplating layer was etched away with a mixed aqueous solution of hydrogen peroxide and sulfuric acid, thereby forming a wiring pattern on the insulating resin layer. This resulted in a fine wiring structure that had good adhesion to the insulating resin layer and had a wiring width of 30 μm and a wiring spacing of 30 μm.

Example 5

Production of Sample Substrate

The surface of a copper foil (thickness: 18 μm; surface roughness ($R_{max}$): 1 μm) used as a support film was roughened by plating with a copper-nickel alloy, after which a chromating treatment was performed, which formed a chromium adhesion layer that served as a metal-containing bonding layer. Next, the chromate-treated surface of this copper foil was coated with a 0.5% γ-glycidoxypropyl trimethoxy silane aqueous solution used as a coupling agent, after which this product was dried for 20 minutes at 100° C., thereby subjecting the metal-containing bonding layer surface of this copper foil to a coupling agent treatment. Next, a thermoplastic polyimide film (thickness: 25 μm; trade name: ESPANEX, made by Nippon Steel Chemical) used as an insulating resin layer was laid over the copper surface of a copper-clad BT resin substrate (100×100×1.6 mm, made by Mitsubishi Gas Chemical) used as a core substrate, and these components were pressed for 60 minutes in a vacuum press at a pressing temperature of 210° C. and a pressure of 3 MPa. The copper foil used as the support film was then etched away with a mixed aqueous solution of hydrogen peroxide and sulfuric acid, which transferred the coupling agent and the metal-containing bonding layer to the insulating resin layer surface. Next, an electroless copper plating film (thickness: 0.3 μm) was formed in the same manner as in Example 1 over the entire surface of the insulating resin layer onto which the coupling agent and the metal-containing bonding layer had been transferred. An electroplated copper film (thickness: 30 μm) was then formed in the same manner as in Example 1 over this electroless copper plating film, using the electroless copper plating film as the electroconductive layer. As a result, a copper plating film was formed as a wiring pattern over the polyimide serving as the insulating resin layer. An annealing treatment was then performed for 1 hour at 170° C., after which the copper plating film was cut into pieces 1 cm wide. The sample substrate in this example was produced as above.

Measurement of Peel Strength

The peel strength was measured in the same manner as in Example 1 for a copper plating film on a sample substrate obtained as above. As a result, the copper plating film in this example exhibited a peel strength of 1.2 kgf/cm with respect to the polyimide. Also, the surface roughness of the insulating resin layer was examined after the copper plating film had been peeled off, which revealed the surface roughness to be an $R_{max}$ of 1 μm.

Example 6

Other than using a copper foil with a surface roughness $R_{max}$ of 3 μm instead of the copper foil with a surface roughness $R_{max}$ of 1 μm as the support film, a sample substrate was produced by the same method as in Example 5. The peel strength of the copper plating film on this sample substrate was measured in the same manner as in Example 1. As a result, the copper plating film in this example exhibited a peel strength of 1.25 kgf/cm. The surface roughness $R_{max}$ of the insulating resin layer after peeling was 3 μm.

Example 7

Production of Sample Substrate

The surface of a copper foil (thickness: 35 μm; surface roughness ($R_{max}$: 2 μm) used as a support film was roughened by plating with a copper-nickel alloy, after which a chromating treatment was performed, which formed a chromium adhesion layer that served as a metal-containing bonding layer. Next, the chromate-treated surface of this copper foil was coated with a 0.5% γ-mercaptopropyl trimethoxy silane aqueous solution used as a coupling agent, after which this product was dried for 15 minutes at 120° C., thereby subjecting the metal-containing bonding layer surface of this copper foil to a coupling agent treatment. Next, a thermosetting epoxy resin sheet (thickness: 50 μm; trade name: SH-9, made by Ajinomoto) used as an insulating resin layer was laid over the copper surface of a copper-clad BT resin substrate (100×100×1.6 mm, made by Mitsubishi Gas Chemical) used as a core substrate. The above-mentioned copper foil that had undergone a coupling agent surface treatment was then laid over the copper-clad BT resin substrate such that the coupling agent treated side was in contact with the epoxy resin, and these components were laminated for 3 minutes in a vacuum laminator at a temperature of 150° C. and a pressure of 1 MPa. After this, the laminate composed of the copper-clad BT resin substrate and the copper foil was taken out of the vacuum laminator and heated for 1 hour at 170° C. under atmospheric pressure, which cured the insulating resin layer. The copper foil used as the support film was then etched away with a cupric chloride aqueous solution, which transferred the coupling agent and the metal-containing bonding layer to the insulating resin layer surface. Next, an electroless copper plating film (thickness: 0.3 μm) was formed in the same manner as in Example 1 over the entire surface of the insulating resin layer onto which the coupling agent and the metal-containing bonding layer had been transferred. An electroplated copper film (thickness: 30 μm) was then formed in the same manner as in Example 1 over this electroless copper plating film, using the electroless copper plating film as the electroconductive layer. As a result, a copper plating film was formed as a wiring pattern over the epoxy resin serving as the insulating resin layer. An annealing treatment was then performed for 1 hour at 170° C., after which the copper plating film was cut into pieces 1 cm wide. The sample substrate in this example was produced as above.

Measurement of Peel Strength

The peel strength was measured in the same manner as in Example 1 for a copper plating film on a sample substrate obtained as above. As a result, the copper plating film in this example exhibited a peel strength of 1.1 kgf/cm with respect to the thermosetting epoxy resin. Also, the surface roughness of the insulating resin layer was examined after the copper plating film had been peeled off, which revealed the surface roughness to be an $R_{max}$ of 2 μm.

Example 8

The surface of a copper foil (thickness: 18 μm; surface roughness ($R_{max}$: 1 μm) used as a support film was roughened by plating with a copper-nickel alloy, after which a chromating treatment was performed, which formed a chromium adhesion layer that served as a metal-containing bonding layer. Next, the chromate-treated surface of this copper foil was coated with a 0.5% methacryloxypropyl trimethoxy silane aqueous solution used as a coupling agent, after which this product was dried for 20 minutes at 100° C., thereby subjecting the surface of the copper foil to a coupling agent treatment. Using the copper foil on which the metal-containing bonding layer had thus been formed and which had undergone coupling agent treatment, a wiring pattern was formed on the insulating resin layer in the same manner as in Example 4 for all subsequent steps. This resulted in a fine wiring structure that had good adhesion to the insulating resin layer and had a wiring width of 30 μm and a wiring spacing of 30 μm.

Comparative Example 1

An attempt was made to produce a sample substrate in the same manner as in Example 1, except that in the vacuum pressing step, just a thermoplastic polyimide film was laminated onto a copper-clad BT resin substrate and vacuum press cured, with no support film being laminated, and electroless copper plating and copper electroplating were performed directly over the polyimide, without a coupling agent being interposed. As a result, part of the copper plating film peeled away from the polyimide surface in the middle of the copper electroplating treatment. The peel strength of the portion that did not peel away was measured in the same manner as in Example 1 and found to be less than 0.1 kgf/cm, meaning that no significant peel strength had been obtained. The surface roughness of the insulating resin layer was an $R_{max}$ of 1 μm.

TABLE 1

|  | Peel Strength (kgf/cm) | Peeled side surface roughness $R_{max}$ (μm) |
|---|---|---|
| Ex. 1 | 1.15 | 1 |
| Ex. 2 | 1.25 | 5 |
| Ex. 3 | 1.0 | 2 |
| Ex. 5 | 1.2 | 1 |
| Ex. 6 | 1.25 | 3 |
| Ex. 7 | 1.1 | 2 |
| Comp. Ex. 1 | <0.1 | 1 |

It can be seen from Table 1 that with a multilayer wiring board manufactured according to the present invention, the interposition of a coupling agent, or the interposition of a coupling agent and a metal-containing bonding layer, between the insulating resin layer and the wiring pattern laminated thereto increases the adhesion of the wiring pattern to the insulating resin layer as compared to when these are not interposed. It can also be seen that this adhesion is increased to a sufficient degree without having to subject the surface of the insulating resin layer to a roughening treatment.

As a summary of the above, the constitution of the present invention, and variations thereof, are listed below as addenda.

What is claimed is:

1. A method for manufacturing a multilayer wiring board having a laminar structure which includes an insulating layer and a wiring layer, the method comprising the steps of:
    sticking a support, which has a surface treated with a coupling agent, onto the insulating layer with the coupling agent interposed therebetween;
    transferring the coupling agent from the support to the insulating layer by removing the support while leaving the coupling agent on the insulating layer;
    partially etching the insulating layer; and
    forming a wiring pattern on the partially etched insulating layer onto which the coupling agent has been transferred.

2. A method for manufacturing a multilayer wiring board, comprising the steps of:
    treating a surface of a support with a coupling agent;
    forming an insulating layer on a surface of a substrate which is formed with a first wiring pattern;
    sticking the support onto the insulating layer with the coupling agent interposed therebetween;
    transferring the coupling agent to the insulating layer by removing the support while leaving the coupling agent on the insulating layer; and
    forming a second wiring pattern on the insulating layer onto which the coupling agent has been transferred.

3. The method according to claim 2, further comprising the steps of:
    forming a via hole in the insulating layer onto which the coupling agent has been transferred; and
    forming a via in the via hole along with forming a second wiring pattern on the insulating layer onto which the coupling agent has been transferred.

4. The method according to claim 3, wherein the step of forming the second wiring pattern comprises the sub-steps of forming an electroless plating film on the insulating layer, forming a resist pattern on said electroless plating film, forming an electroplating film in the non-mask region of said resist pattern, removing the resist pattern, and removing the electroless plating film not covered by the electroplating film.

5. The method according to claim 2, wherein the support is pressed onto the insulating layer in the step of sticking on the support.

6. The method according to claim 2, wherein the step of sticking on the support is performed under heating.

7. The method according to claim 2, wherein the support comprises a metal material selected from the group consisting of copper, aluminum, copper alloys, and aluminum alloys.

8. The method according to claim 2, wherein the support has a surface roughness (maximum height roughness: $R_{max}$) of no more than 5 μm.

9. A method for manufacturing a multilayer wiring board having a laminar structure which includes an insulating layer and a wiring layer, the method comprising the steps of:
   sticking a support, which is formed with a metal-containing bonding layer having an exposed surface treated with a coupling agent, onto the insulating layer with the coupling agent and the metal-containing bonding layer interposed therebetween;
   transferring the coupling agent and the metal-containing bonding layer from the support to the insulating layer by removing the support while leaving the coupling agent and the metal-containing bonding layer on the insulating layer;
   partially etching the insulating layer; and
   forming a wiring pattern on the partially etched insulating layer onto which the coupling agent and the metal-containing bonding layer have been transferred.

10. A method for manufacturing a multilayer wiring board, comprising the steps of:
    forming a metal-containing bonding layer on a support;
    treating an exposed surface of the metal-containing bonding layer with a coupling agent;
    forming an insulating layer on a surface of a substrate which is formed with a first wiring pattern;
    sticking the support onto the insulating layer with the coupling agent and the metal-containing bonding layer interposed therebetween;
    transferring the coupling agent and the metal-containing bonding layer to the insulating layer by removing the support while leaving the coupling agent and the metal-containing bonding layer on the insulating layer; and
    forming a second wiring pattern on the metal-containing bonding layer.

11. The method according to claim 10, further comprising the steps of:
    forming a via hole in the insulating layer onto which the coupling agent and the metal-containing bonding layer have been transferred; and
    forming a via in the via hole along with forming a second wiring pattern on the metal-containing bonding layer.

12. The method according to claim 11, wherein the step of forming the second wiring pattern comprises the sub-steps of forming an electroless plating film on the metal-containing bonding layer, forming a resist pattern on said electroless plating film, forming an electroplating film in the non-mask region of said resist pattern, removing the resist pattern, and removing the electroless plating film not covered by the electroplating film.

13. The method according to claim 10, wherein the metal-containing bonding layer comprises a metal compound containing a metal selected from the group consisting of chromium, copper, nickel, cobalt, and zinc.

14. The method according to claim 13, wherein the metal compound is an oxide or a hydroxide of a metal selected from the group consisting of chromium, copper, nickel, cobalt, and zinc.

15. The method according to claim 10, wherein the metal-containing bonding layer is provided in a coverage of at least 10% with respect to the insulating layer.

16. The method according to claim 10, wherein the metal-containing bonding layer has a thickness of 0.01 to 1.0 μm.

17. The method according to claim 10, wherein the support comprises a metal material selected from the group consisting of copper, aluminum, copper alloys, and aluminum alloys.

18. The method according to claim 10, wherein the support has a surface roughness (maximum height roughness: $R_{max}$) of no more than 5 μm.

* * * * *